United States Patent
Chen

(10) Patent No.: US 7,982,648 B2
(45) Date of Patent: Jul. 19, 2011

(54) DYNAMIC ELEMENT MATCHING DIGITAL/ANALOG CONVERSION SYSTEM AND SIGMA-DELTA MODULATOR USING THE SAME

(75) Inventor: Chih Wei Chen, Yonghe (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 12/662,796

(22) Filed: May 4, 2010

(65) Prior Publication Data
US 2010/0277355 A1    Nov. 4, 2010

(30) Foreign Application Priority Data
May 4, 2009   (TW) ............................. 98114690 A

(51) Int. Cl.
*H03M 3/00* (2006.01)
(52) U.S. Cl. ....................... 341/143; 341/155
(58) Field of Classification Search .............. 341/143, 341/155, 142, 144, 126, 118; 375/252, 254
See application file for complete search history.

(56) References Cited

U.S. PATENT DOCUMENTS

| | | |
|---|---|---|
| 5,221,926 A | 6/1993 | Jackson |
| 6,304,608 B1 | 10/2001 | Chen et al. |
| 6,753,799 B2 | 6/2004 | Colonna et al. |
| 7,183,955 B1 * | 2/2007 | Shih .............................. 341/143 |

* cited by examiner

*Primary Examiner* — Joseph Lauture
(74) *Attorney, Agent, or Firm* — Bacon & Thomas, PLLC

(57) ABSTRACT

A dynamic element matching sigma-delta modulator includes an adder to receive an analog input signal and a feedback signal to generate an error signal; a loop filter to generate a filtered signal according to the error signal; a quantizer to change the filtered signal into a quantized output signal; a digital/analog converter (DAC) having a plurality of digital/analog elements to generate the feedback signal corresponding to the quantized output signal; and a dynamic element matching device to receive the quantized output signal to accordingly set an element of the DAC to be a previous non-participant element and the other elements to be previous participant elements, and reselects participant elements according to the quantized output signal and the previous participant elements for further generating the feedback signal corresponding to the quantized output signal.

16 Claims, 16 Drawing Sheets

FIG. 3 (Prior Art)

|     |              | E1 | E2 | E3 | E4 | E5 | E6 | E7 | E8 |
|-----|--------------|----|----|----|----|----|----|----|----|
| t1  | Input code=5 | 1  | 4  |    | 2  | 5  | 3  |    |    |
| t2  | Input code=2 |    |    | 2  |    |    |    | 1  |    |
| t3  | Input code=8 | 3  | 6  | 8  | 1  | 4  | 5  | 7  | 2  |
| t4  | Input code=4 | 3  |    |    | 1  | 4  |    |    | 2  |
| t5  | Input code=3 |    | 2  |    | 3  |    | 1  |    |    |
| t6  | Input code=1 |    |    |    |    |    |    | 1  |    |
| t7  | Input code=1 |    |    | 1  |    |    |    |    |    |
| t8  | Input code=5 | 3  |    |    | 4  | 1  | 5  |    | 2  |
| t9  | Input code=7 | 7  | 1  | 4  | 5  | 2  |    | 3  | 6  |
| t10 | Input code=6 |    | 3  | 6  | 4  | 1  | 2  | 5  | 7  |

FIG. 7(Prior Art)

|  | | E1 | E2 | E3 | E4 | E5 | E6 | E7 | E8 |
|---|---|---|---|---|---|---|---|---|---|
| t1 | Input code=5 | 1 | 2 | 3 | 4 | 5 | | | |
| t2 | Input code=2 | | | | | | 1 | 2 | |
| t3 | Input code=8 | 2 | 3 | 4 | 5 | 6 | 7 | 8 | 1 |
| t4 | Input code=4 | 1 | 2 | 3 | 4 | | | | |
| t5 | Input code=3 | | | | | 1 | 2 | 3 | |
| t6 | Input code=1 | 1 | | | | | | | |
| t7 | Input code=1 | | 1 | | | | | | |
| t8 | Input code=5 | | | 1 | 2 | 3 | 4 | 5 | |

FIG. 9 (Prior Art)

|     | E1 | E2 | E3 | E4 | E5 | E6 | E7 | E8 |
|-----|----|----|----|----|----|----|----|----|
| t1  Input code=5 | 1 | 2 | 3 | 4 | 5 |  |  | ▨ |
| t2  Input code=3 | 3 |  |  |  |  |  | 1 | 2 |
| t3  Input code=1 |  | 1 |  |  |  |  |  | ▨ |
| t4  Input code=6 | 6 |  | 1 | 2 | 3 | 4 | 5 | ▨ |
| t5  Input code=8 | 8 | 1 | 2 | 3 | 4 | 5 | 6 | 7 |
| t6  Input code=4 |  | ▨ | 1 | 2 | 3 | 4 |  |  |
| t7  Input code=2 |  | ▨ |  |  |  |  | 1 | 2 |
| t8  Input code=7 | 1 | ▨ | 2 | 3 | 4 | 5 | 6 | 7 |
| t9  Input code=8 | 1 | 2 | 3 | 4 | 5 | 6 | 7 | 8 |
| t10 Input code=1 | 1 |  |  | ▨ |  |  |  |  |

FIG. 15

| | | E1 | E2 | E3 | E4 | E5 | E6 | E7 | E8 |
|---|---|---|---|---|---|---|---|---|---|
| t1 | Input code=5 | 1 | 2 | 3 | 4 | 5 | | | ▨ |
| t2 | Input code=3 | 3 | | | | | 1 | 2 | ▨ |
| t3 | Input code=1 | | 1 | | | | | | ▨ |
| t4 | Input code=6 | 6 | | 1 | 2 | 3 | 4 | 5 | ▨ |
| t5 | Input code=8 | 8 | 1 | 2 | 3 | 4 | 5 | 6 | 7 |
| t6 | Input code=4 | | 1 | 2 | 3 | ▨ | 4 | | |
| t7 | Input code=2 | | | | | ▨ | | 1 | 2 |
| t8 | Input code=7 | 1 | 2 | 3 | 4 | ▨ | 5 | 6 | 7 |
| t9 | Input code=8 | 1 | 2 | 3 | 4 | 5 | 6 | 7 | 8 |
| t10 | Input code=1 | 1 | | ▨ | | | | | |

FIG. 16

|  | E1 | E2 | E3 | E4 | E5 | E6 | E7 | E8 |
|---|---|---|---|---|---|---|---|---|
| t1 Input code=5 | 1 | 2 | 3 | 4 | 5 |  |  | ▨ |
| t2 Input code=3 | 3 |  |  |  |  | 1 | 2 | ▨ |
| t3 Input code=1 |  | 1 |  |  |  |  |  | ▨ |
| t4 Input code=6 | 6 |  | 1 | 2 | 3 | 4 | 5 | ▨ |
| t5 Input code=8 | 8 | 1 | 2 | 3 | 4 | 5 | 6 | ▨7 |
| t6 Input code=4 |  |  |  | 4 | ▨ | 3 | 2 | 1 |
| t7 Input code=2 |  | 2 | 1 |  | ▨ |  |  |  |
| t8 Input code=7 | 1 | 7 | 6 | 5 | ▨ | 4 | 3 | 2 |
| t9 Input code=8 | 1 | 8 | 7 | 6 | ▨5 | 4 | 3 | 2 |
| t10 Input code=2 |  |  | ▨ | 1 | 2 |  |  |  |

DYNAMIC ELEMENT MATCHING DIGITAL/ANALOG CONVERSION SYSTEM AND SIGMA-DELTA MODULATOR USING THE SAME

BACKGROUND OF THE INVENTION

1. Field of the Invention

The present invention relates to the technical field of data conversion and, more particularly, to a dynamic element matching technique for digital/analog conversion system and a sigma-delta modulator using the same.

2. Description of Related Art

Analog/digital data conversion technologies exist and are widely used for many years. A digital/analog converter (DAC) or analog/digital converter (ADC) is provided to encode a high-resolution signal into a low-resolution signal by using a pulse density modulation, which is an analog/digital or digital/analog conversion technique derived from the delta-sigma modulation principle. The ADC or DAC can be implemented by a low-cost CMOS process.

The sigma-delta modulator (SDM) is an over-sampling ADC or DAC which is characterized by high dynamic range and high resolution and is successfully used in communication and other signal processing fields. One-bit SDMs are widely used due to the linearity. However, for gaining a higher resolution and broader bandwidth without increasing the over-sampling rate, multi-bit SDMs are used to reduce the quantized noise power. In the multi-bit SDM, mismatching may exist between digital/analog elements of the feedback multi-bit DAC, resulting in non-linearity. FIG. 1 is a schematic diagram of a conventional N-bit sigma-delta modulator 100, where N is an integer greater than one.

The N-bit sigma-delta modulator 100 includes an adder 110, a loop filter 120, an N-bit quantizer 130 and an N-bit digital/analog converter (DAC) 140. The adder 110 receives an analog input signal $V_{in}$, and subtracts the signal $V_{in}$ from an analog feedback signal $V_{FB}$ outputted by the N-bit DAC 140. The loop filter 120 is connected to the adder 110 in order to receive the output of the adder 110 and generate a filtered analog output to the N-bit quantizer 130. The N-bit quantizer 130 quantizes the analog output of the loop filter 120 to thereby generate a digital code to the N-bit DAC 140. The N-bit DAC 140 includes a plurality of digital/analog elements to convert the digital code into an analog feedback signal $V_{FB}$ and inputs the feedback signal to the adder 110. The digital/analog elements, such as capacitors, resistors, current sources and the like, of the N-bit DAC 140 can lead to mismatching due to process variation and degradation. Such a mismatching among the elements negatively affects the linearity of a feedback path and generates distortion and noise at output.

A dynamic element matching (DEM) technique is introduced to overcome the non-linearity problem of the multi-bit DAC. FIG. 2 is a schematic diagram of a conventional N-bit sigma-delta modulator 200 using the DEM technique. In FIG. 2, a dynamic element matching device 150 is added between the N-bit quantizer 130 and the N-bit DAC 140. The dynamic element matching device 150 randomly selects the digital/analog elements of the N-bit DAC 140 to thereby distribute the non-linear error over the spectrum. In addition, one of the DEM technique is referred to as data weighted average (DWA). FIG. 3 is a schematic graph of an operation of DWA technique, which is particularly described in U.S. Pat. No. 5,221,926 granted to Jackson for a "Circuit and method for cancelling nonlinearity error associated with component value mismatches in a data converter". As shown in FIG. 3, an N-bit DAC 140 with 12 digital/analog elements is used to describe the operation principle of the DWA technique applied to the DEM 150, where Y-axis indicates the input digital codes of each time slot and X-axis indicates grey blocks for the selected elements and digits for selected orders. The DWA logic sequentially selects the digital/analog elements based on each input digital code and predetermined order. For example, at time slot t1, the input digital code is 6, so the DWA logic selects the elements in an order of E3 to E8. At time slot t2, the input digital code is 5, so the DWA logic selects the element E9 following the last selected element E8 and subsequently selects the element E10 to E12 and then E1. The sequence of selecting elements is indicated by the arrow. The DWA technique can average the probabilities of each digital/analog element to be selected. Accordingly, the mismatch error of the DAC is shifted to a higher frequency band that is easily implemented and has the effect of first order noise shaping.

However, when the input digital code is constant 6, the elements E3 to E8 or E9 to E2 are normally selected, and a fixed pattern is generated. Thus fail to average mismatch error between the elements and reduce the signal-to-noise plus distortion ratio (SNDR). FIG. 4 is a schematic graph of a typical SNDR to input amplitude relationship. In FIG. 4, the SNDR to input amplitude graph is based on a three-order sigma-delta modulator (SDM) with a 3-bit DAC using the DWA technique. As shown in FIG. 4, due to the fixed pattern, the SNDR is reduced.

FIG. 5 is a schematic graph of an operation of DWA technique, which is particularly described in U.S. Pat. No. 6,304,608 granted to Chen et al. for a "Multibit sigma-delta converters employing dynamic element matching with reduced baseband tones". As shown in FIG. 5, an N-bit DAC with eight digital/analog elements E1 to E8 is used, and a digital/analog element E9 is added. The DWA logic sequentially selects the digital/analog elements based on each input digital code and predetermined order. For example, at time slot t1, the input digital code is 5, so the DWA logic selects the elements in an order of E1 to E5. At time slot t2, the input digital code is 2, so the DWA logic selects the element E6 following the last selected element E5 and subsequently selects the element E7. The sequence of selecting elements is indicated by the arrow. The digital/analog element E9 is added to avoid the fixed pattern since the maximum input code is 8 and the number of the digital/analog elements is nine (E1 to E9).

However, in the DWA technique, the efficiency of mismatch averaging is determined on the rotation speed, i.e., the frequency of each element used. The maximum input code is only 8, and accordingly the frequency of the digital/analog elements E1 to E9 used is reduced, since the digital/analog element E9 is added, and the SNDR is further reduced. In addition, due to the added digital/analog element E9, the analog circuitry becomes more complex to avoid the output amplitude from becoming 8/9 times of the original one, resulting in limiting the use range. FIG. 6 is a schematic graph of a typical SNDR to input amplitude relationship. As shown in FIG. 6, due to the added digital/analog element E9, the SNDR is reduced.

FIG. 7 is a schematic graph of an operation of DWA technique, which is particularly described in U.S. Pat. No. 7,183,955 granted to Shih for a "Sigma-delta modulator, D/A conversion system and dynamic element matching method". As shown in FIG. 7, an N-bit DAC with eight digital/analog elements E1 to E8 is used. The elements E1 to E8 are divided into three groups G1, G2 and G3, where the group G1 contains E1 to E3, the group G2 contains E4 and E5, and the group G3 contains E6 to E8. At time slot t1, the input digital code is 5, so the DWA logic is based on the group order to select the elements in a sequence of the element E1 of the group G1, the element E4 of the group G2, the element E6 of the group G3, the element E2 of the group G1 and the element E5 of the group G2. At time slot t2, the input digital code is 2, so the DWA logic selects the first remaining element from the group G3 following the last selected group G2, i.e., the element E7 of the group G3, and subsequently selects the element E3 of the group G1. Accordingly, the fixed pattern is avoided.

However, when the input digital code is a greater number (such as 6, 7), the elements E4 and E5 of the group G2 are frequently used to thereby generate a kind of fixed pattern and reduce the SNDR. FIG. 8 is a schematic graph of a typical SNDR to input amplitude relationship. As shown in FIG. 8, when the input amplitude is higher (i.e., the input digital code is a greater number), the SNDR is relatively reduced. Namely, an ADC or DAC system may easily encounter a mismatch error when such a way is applied with a higher input digital code.

FIG. 9 is a schematic graph of an operation of DWA technique, which is particularly described in U.S. Pat. No. 6,753,799 granted to Colonna et al. for a "Randomizer for sigma-delta-type converter". As shown in FIG. 9, an N-bit DAC with eight digital/analog elements E1 to E8 is used, where the digital/analog element E8 is used only when the input digital code is the maximum. As shown in FIG. 9, at time slot t1, the input digital code is 5, so the DWA logic selects the elements in an order of E1 to E5. At time slot t2, the input digital code is 2, so the DWA logic selects the element E6 following the last selected element E5 and subsequently selects the element E7. At time slot t3, since the input digital code is the maximum, i.e., 8, and the element E7 is selected last in time slot t2, the element E8 following the element E7 is selected, and subsequently the elements E1 to E7 are selected in order. At time slot t4, the input digital code is 4, and in this case the digital/analog element E8 is not used, so the elements E1 to E4 are selected in order. Thus, the disorder degree is increased to thereby avoid generating a fixed pattern. However, such a way can only increase limited disorder degree. FIG. 10 is a schematic graph of a typical SNDR to input amplitude relationship. As shown in FIGS. 8 and 10, the SNDR is relatively reduced when the input amplitude is at −5 dB while the SNDR in FIG. 8 is relatively reduced when the input amplitude is at −10 dB.

Therefore, it is desirable to provide an improved DWA technique for an ADC or DAC system to mitigate and/or obviate the aforementioned problems.

SUMMARY OF THE INVENTION

The object of the present invention is to provide a dynamic element matching technique for sigma-delta modulator, which can increase the disorder degree on selecting the digital/analog elements and increase the SNDR.

According to a feature of the invention, a dynamic element matching technique for sigma-delta modulator is provided. The modulator includes an adder, a loop filter, a quantizer, a digital/analog converter and a dynamic element matching device. The adder receives an analog input signal and a feedback signal to thereby generate an error signal based on a difference between the analog input signal and the feedback signal. The loop filter is connected to the adder in order to receive the error signal to thereby generate a filtered signal. The quantizer is connected to the loop filter in order to change the filtered signal into a quantized output signal. The digital/analog converter (DAC) is connected to the adder and has a plurality of digital/analog elements to generate the feedback signal corresponding to the quantized output signal. The dynamic element matching device is connected between the quantizer and the DAC in order to receive the quantized output signal to accordingly select the digital/analog elements of the DAC. The dynamic element matching device sets an element of the DAC to be a previous non-participant element and the other elements to be previous participant elements, and reselects participant elements according to the quantized output signal and the previous participant elements for further generating the feedback signal corresponding to the quantized output signal.

According to another feature of the invention, a dynamic element matching digital/analog conversion system is provided. The system includes a digital/analog converter (DAC) and a dynamic element matching device. The DAC has a plurality of digital/analog elements to generate an analog output signal corresponding to a digital input signal. The dynamic element matching device is connected to the DAC in order to receive the digital input signal to thereby select the digital/analog elements of the DAC. The dynamic element matching device sets an element of the DAC to be a previous non-participant element and the other elements to be previous participant elements, and reselects the digital/analog elements according to the digital input signal and the participant elements for further generating the analog output signal corresponding to the digital input signal.

Other objects, advantages, and novel features of the invention will become more apparent from the following detailed description when taken in conjunction with the accompanying drawings.

BRIEF DESCRIPTION OF THE DRAWINGS

Figure 3:
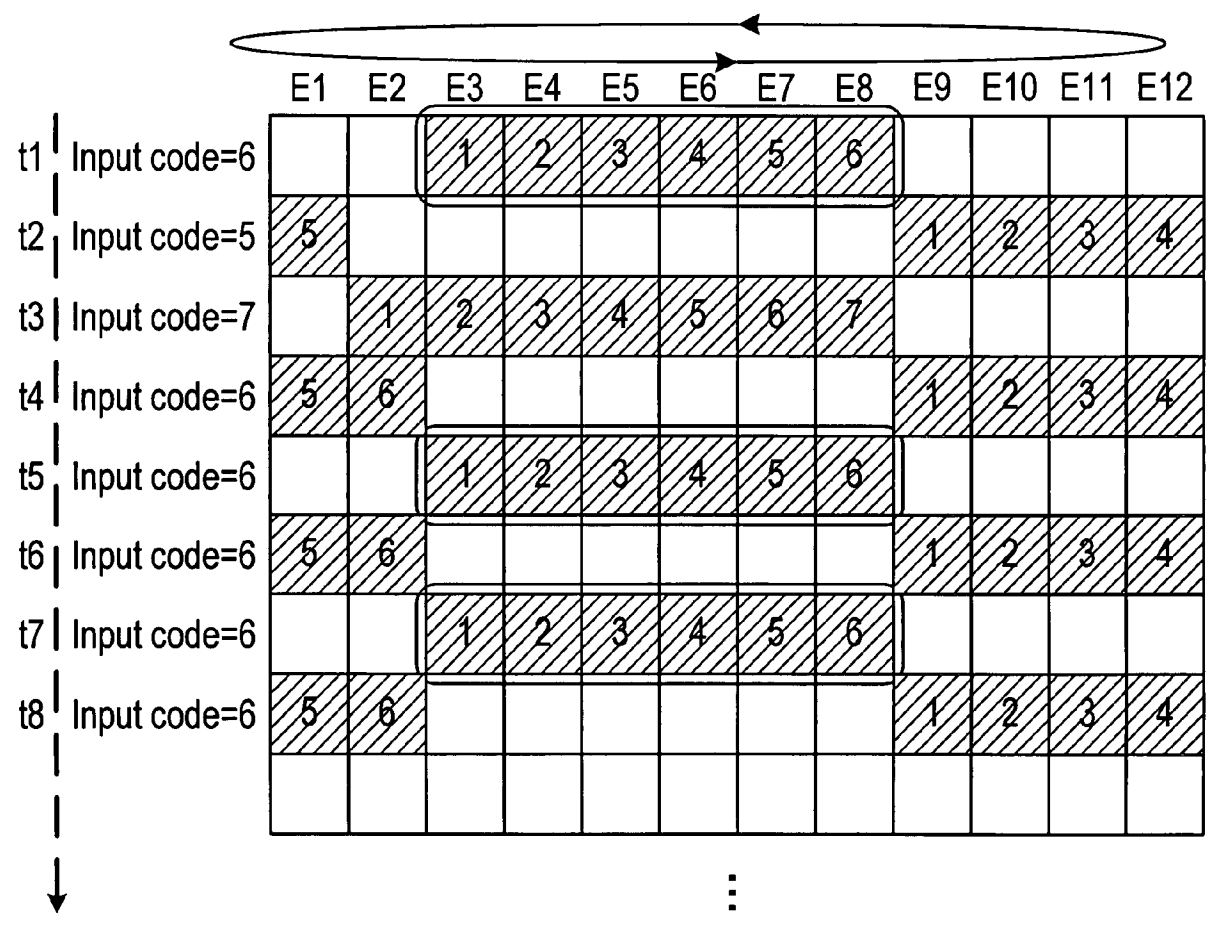

FIG. 3 is a schematic graph of an operation of a typical data weighted average (DWA) technique;

FIG. 7 is a schematic graph of a further operation in the prior art;

FIG. 9 is a schematic graph of another further operation in the prior art;

FIG. 15 is a schematic graph of another operation of FIG. 11 according to an embodiment of the invention;

FIG. 16 is a schematic graph of a further operation of FIG. 11 according to an embodiment of the invention; and FIG. 17 is a schematic graph of another further operation of FIG. 11 according to an embodiment of the invention.

DETAILED DESCRIPTION OF THE PREFERRED EMBODIMENT

Figure 11:
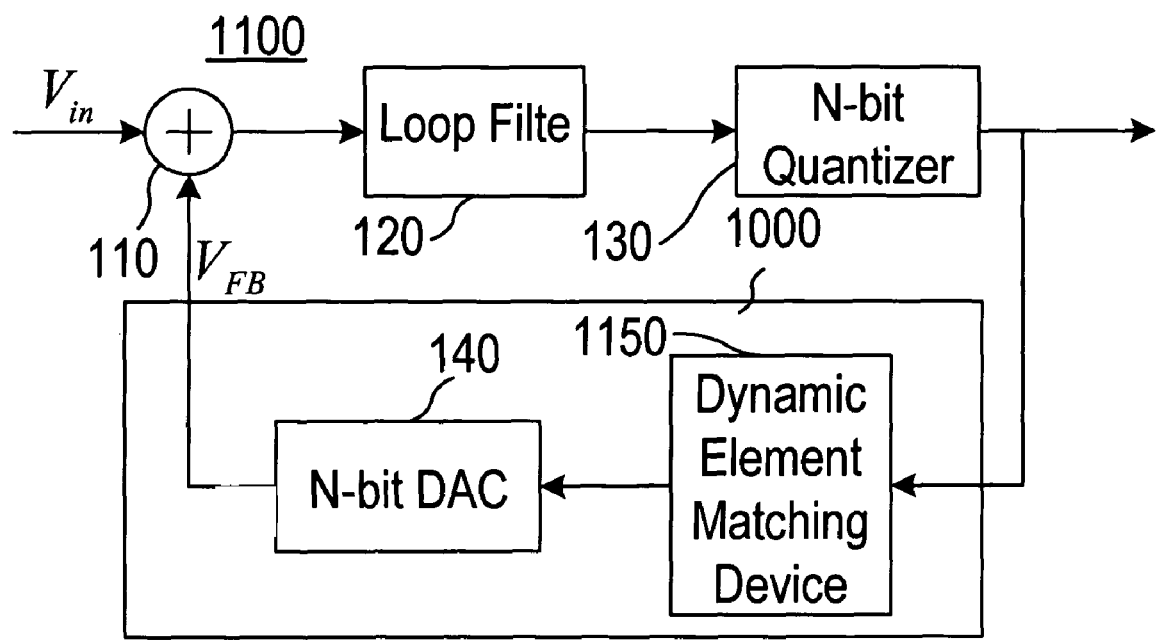
FIG. 11 is a block diagram of a dynamic element matching sigma-delta modulator according to an embodiment of the invention.

With reference to FIG. 11, there is shown a block diagram of a dynamic element matching sigma-delta modulator 1100 in accordance with an embodiment of the invention. The modulator 1100 includes an adder 110, a loop filter 120, a quantizer 130 and a digital/analog conversion system 1000. The digital/analog conversion system 1000 has a digital/analog converter 140 and a dynamic element matching device 1150.

The adder 1110 receives an analog input signal $V_{in}$ and a feedback signal $V_{FB}$ to thereby generate an error signal based on a difference between the analog input signal $V_{in}$ and the feedback signal $V_{FB}$. The loop filter 120 is connected to the adder 110 in order to receive the error signal to thereby generate a filtered signal. The quantizer 130 is connected to the loop filter 120 in order to change the filtered signal into a quantized output signal. The quantizer 130 is a multi-bit quantizer.

The digital/analog converter (DAC) 140 is connected to the adder 110. The DAC 140 is a multi-bit DAC. The DAC 140 has a plurality of digital/analog elements to generate the feedback signal $V_{FB}$ corresponding to the quantized output signal to the adder 110. The digital/analog elements are capacitors, resistors, current sources or the like.

The dynamic element matching device 1150 is connected between the quantizer 130 and the DAC 140 in order to receive the quantized output signal to accordingly select the digital/analog elements of the DAC 140.

Figure 1:
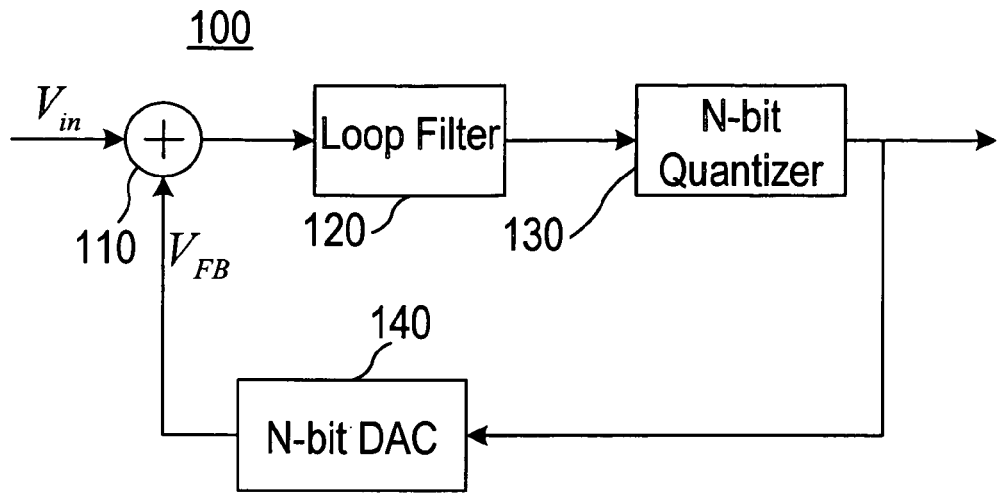
FIG. 1 is a schematic diagram of a conventional N-bit sigma-delta modulator.
Figure 2:
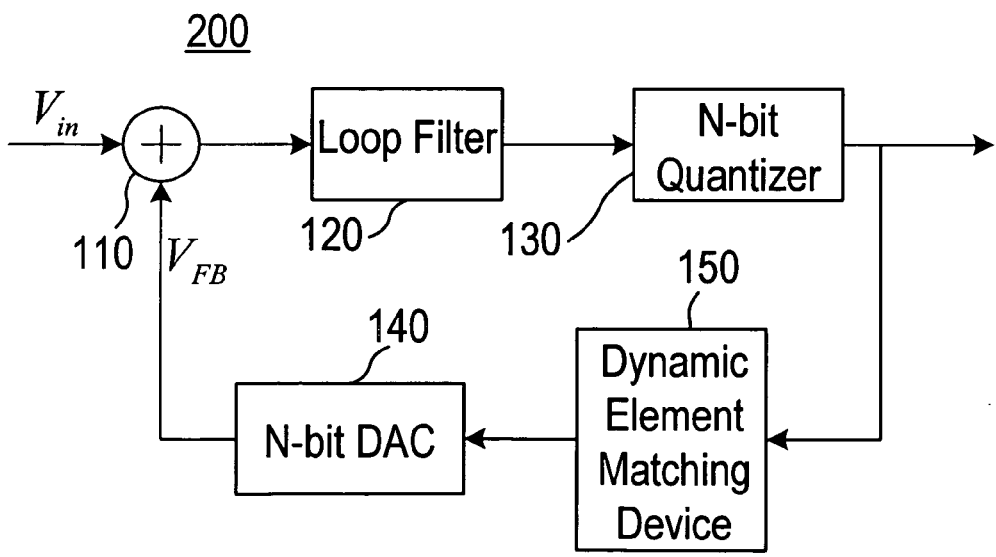
FIG. 2 is a schematic diagram of a conventional N-bit sigma-delta modulator typically using a dynamic element matching (DEM) technique.
Figure 4:
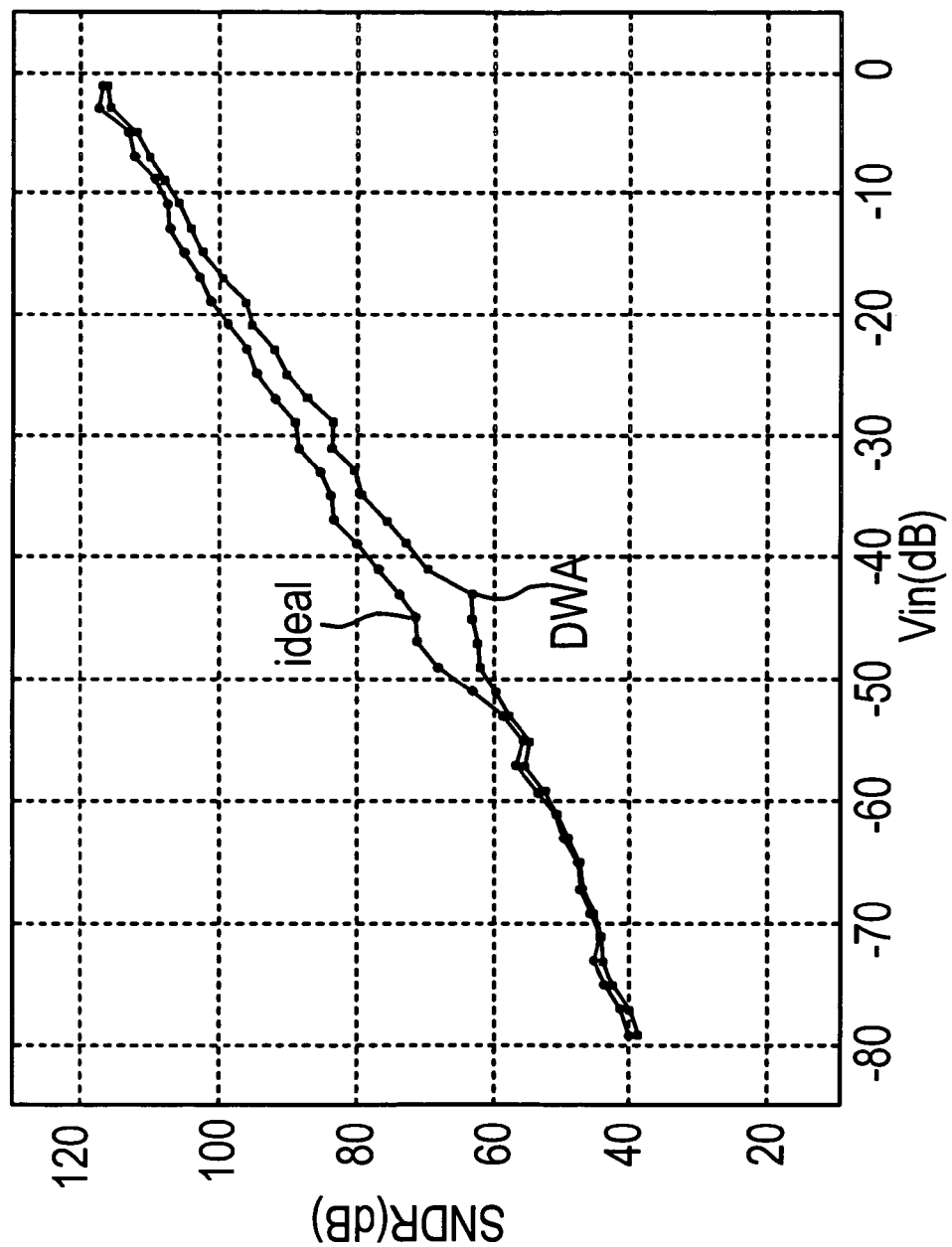
FIG. 4 is a schematic graph of a typical SNDR to input amplitude relationship of FIG. 3.
Figure 5:
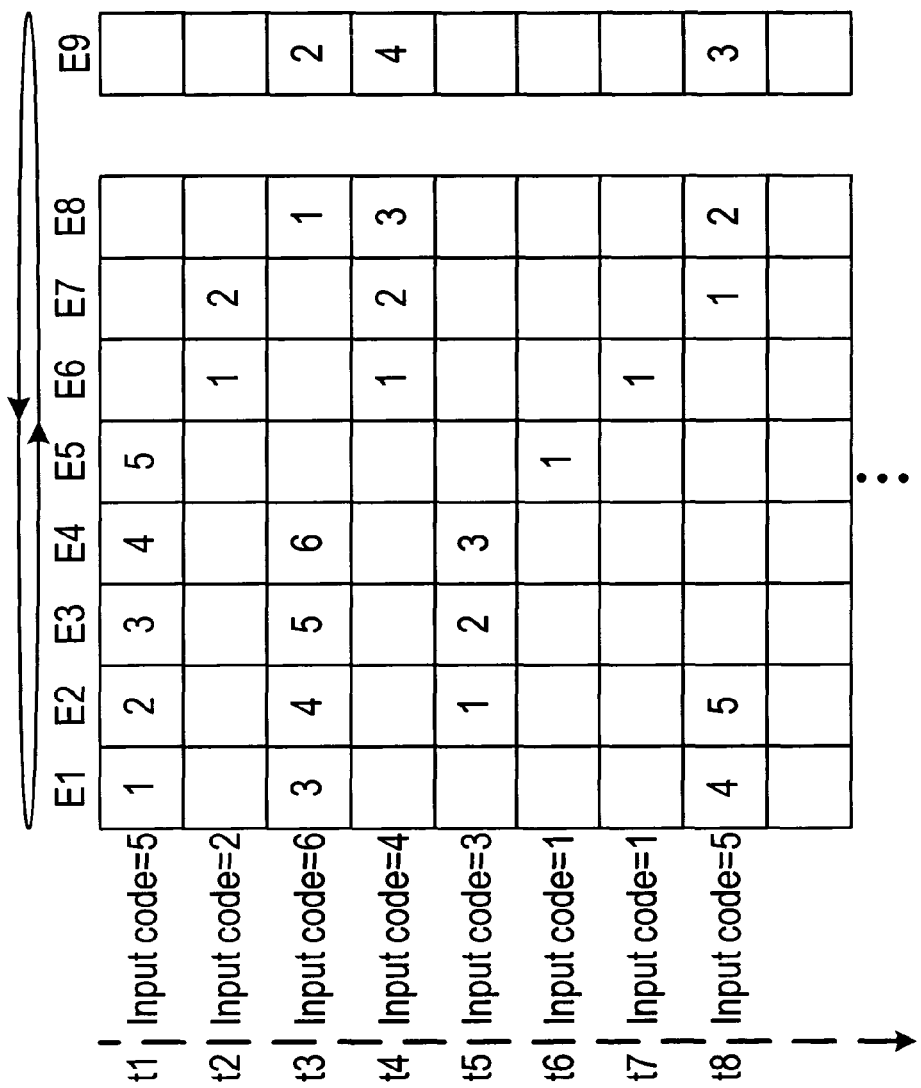
FIG. 5 is a schematic graph of another operation in the prior art.
Figure 6:
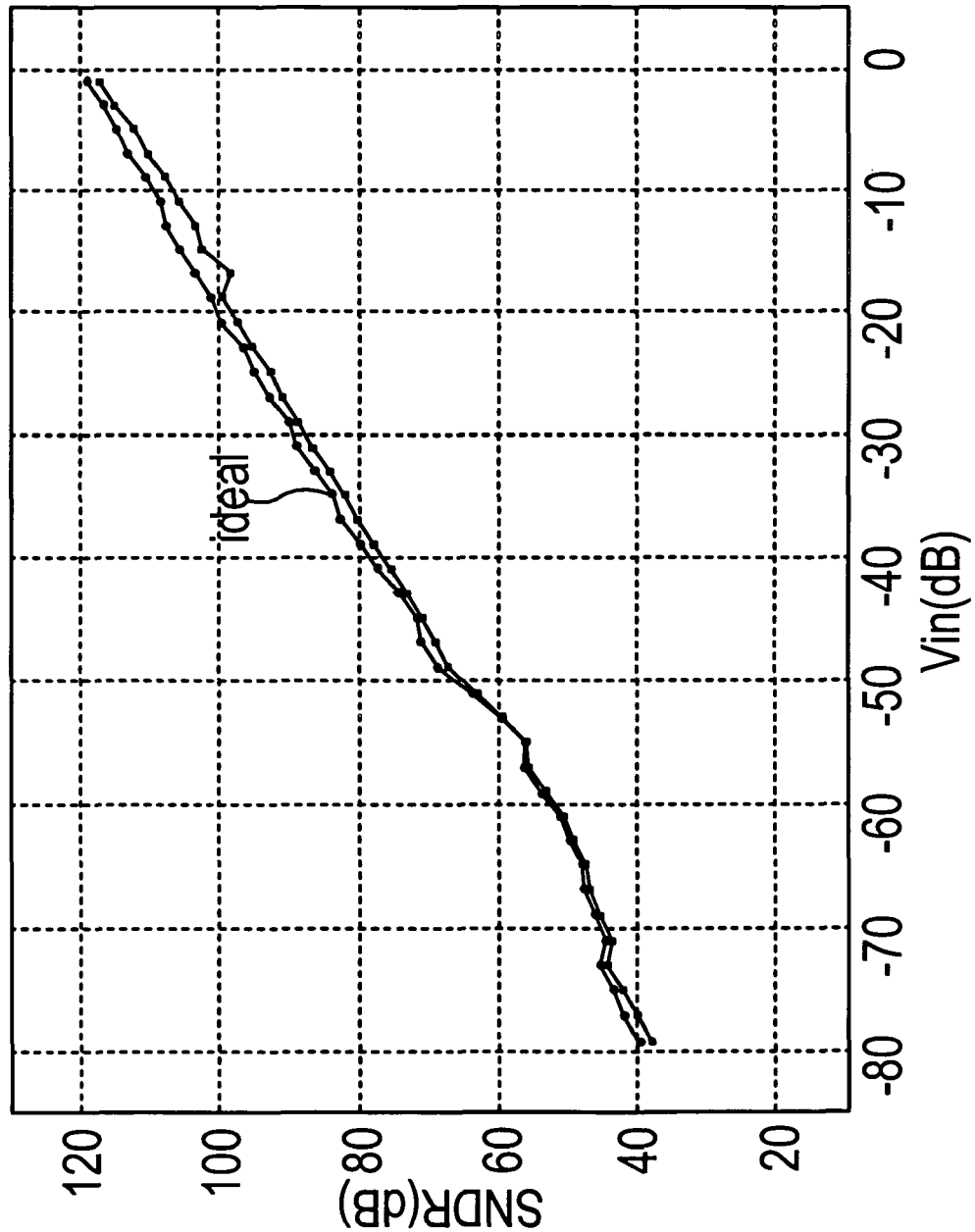
FIG. 6 is a schematic graph of a typical SNDR to input amplitude relationship of FIG. 5.
Figure 8:
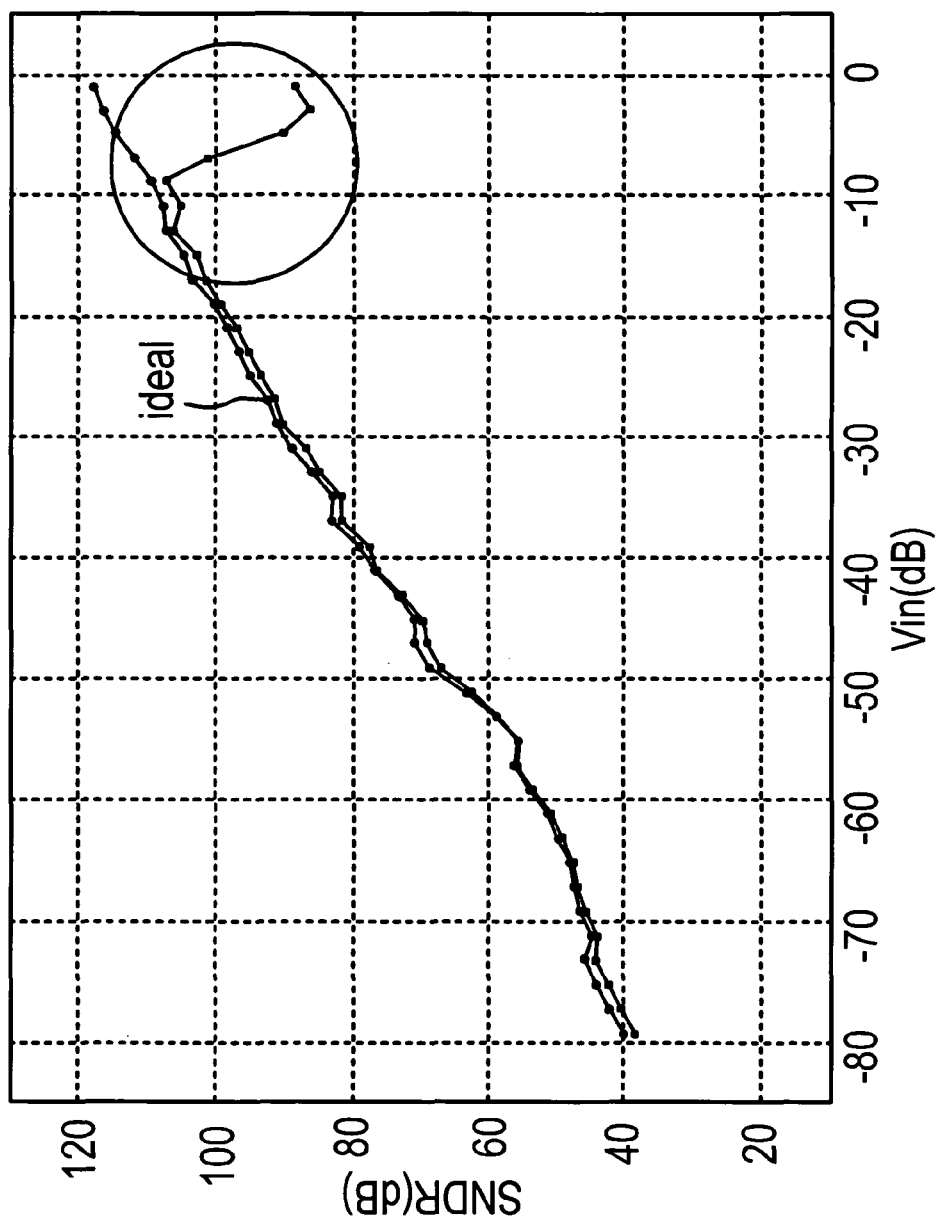
FIG. 8 is a schematic graph of a typical SNDR to input amplitude relationship of FIG. 7.

The components indicated by the same number in FIGS. 11 and 2 have the same function. Accordingly, the dynamic element matching device 1150 in FIG. 11 is different from that in FIG. 2 and its operation is described as follows.

Assume the N-bit DAC 140 contains eight digital/analog elements E1 to E8. The dynamic element matching device 1150 sets one of the digital/analog elements to be a non-participant element and the other elements to be participant elements, and further reselects the participant elements according to the quantized output signal and the participant elements for generating the feedback signal $V_{FB}$ corresponding to the quantized output signal. For example, the N-bit DAC 140 contains eight digital/analog elements E1 to E8, and the dynamic element matching device 1150 sets the digital/analog element E8 to be a non-participant element and the other elements E1 to E7 to be participant elements.

When the quantized output signal is a predetermined signal, the dynamic element matching device 1150 resets the digital/analog element E8 to be a participant element and one of the elements E1 to E7 to be a non-participant element. The predetermined signal can be the maximum of the quantized output signal, for example.

Figure 12:
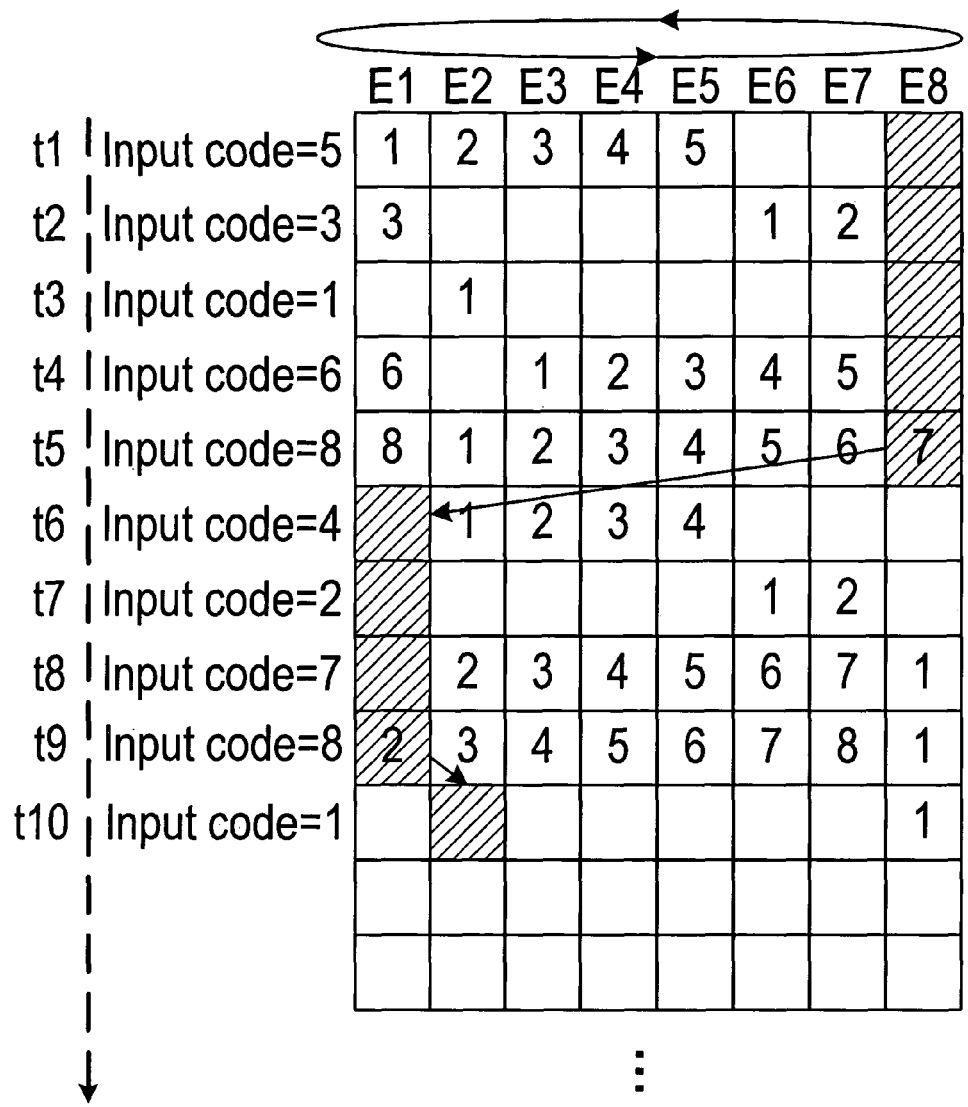
FIG. 12 is a schematic graph of an operation of FIG. 11 according to an embodiment of the invention.

FIG. 12 is a schematic graph of an operation of the dynamic element matching device 1150 including the DAC with eight digital/analog elements according to an embodiment of the invention. In this case, the dynamic element matching device 1150 sets the digital/analog element E8 to be a non-participant element and the other elements E1 to E7 to be participant elements. In FIG. 12, Y-axis indicates the input digital code of each time slot, i.e., the quantized output signal output by the N-bit quantizer 130, marked blocks indicate the non-participant elements, and X-axis indicates the elements in each selected order.

The dynamic element matching device 1150 selects the participant elements E1 to E7 based on a second predetermined order to thereby generate the feedback signal $V_{FB}$ corresponding to the quantized output signal. The dynamic element matching device 1150 selects ones from the participant elements as the digital/analog element following the last selected digital/analog element to thereby generate the feedback signal $V_{FB}$ corresponding to the quantized output signal. The number of selected digital/analog elements equals to the quantized output signal. Namely, as shown in FIG. 12, one digital/analog element is selected when the input code is 1, and six digital/analog elements are selected when the input code is 6, and so on.

When the N-bit quantizer 130 transmits a digital code at a certain time slot, the dynamic element matching device 1150 based on the input digital code and the last selected digital/analog elements to reselect the digital/analog elements from the participant elements, and the number of reselected elements equals to the input digital code. For example, at time slot t1, the input digital code is 5, so the dynamic element matching device 1150 select E1 to E5 in order from the participant elements according to the arrow sequence, and at time slot t2, the input digital code is 3, so the dynamic element matching device 1150 selects E6 to E7 and then E1 in order from the participant elements according to the arrow sequence.

At time slot t5, the input digital code is the maximum, 8, and accordingly the non-participant element E8 is also selected. That is, all elements from E1 to E8 are selected at time slot t5. Next, at time slot t6, the dynamic element matching device 1150 selects and sets an new non-participant element from the participant elements based on the first predetermined order. In this case, the dynamic element matching device 1150 selects the digital/analog element E1 right after the non-participant element E8 as the alternate non-participant element. Accordingly, at time slot t6, the input digital code is 4 and the element E1 is the non-participant element, so the elements E2 to E5 are selected. The remaining operations can be derived in a similar manner, and thus a detailed description is deemed unnecessary.

Figure 10:
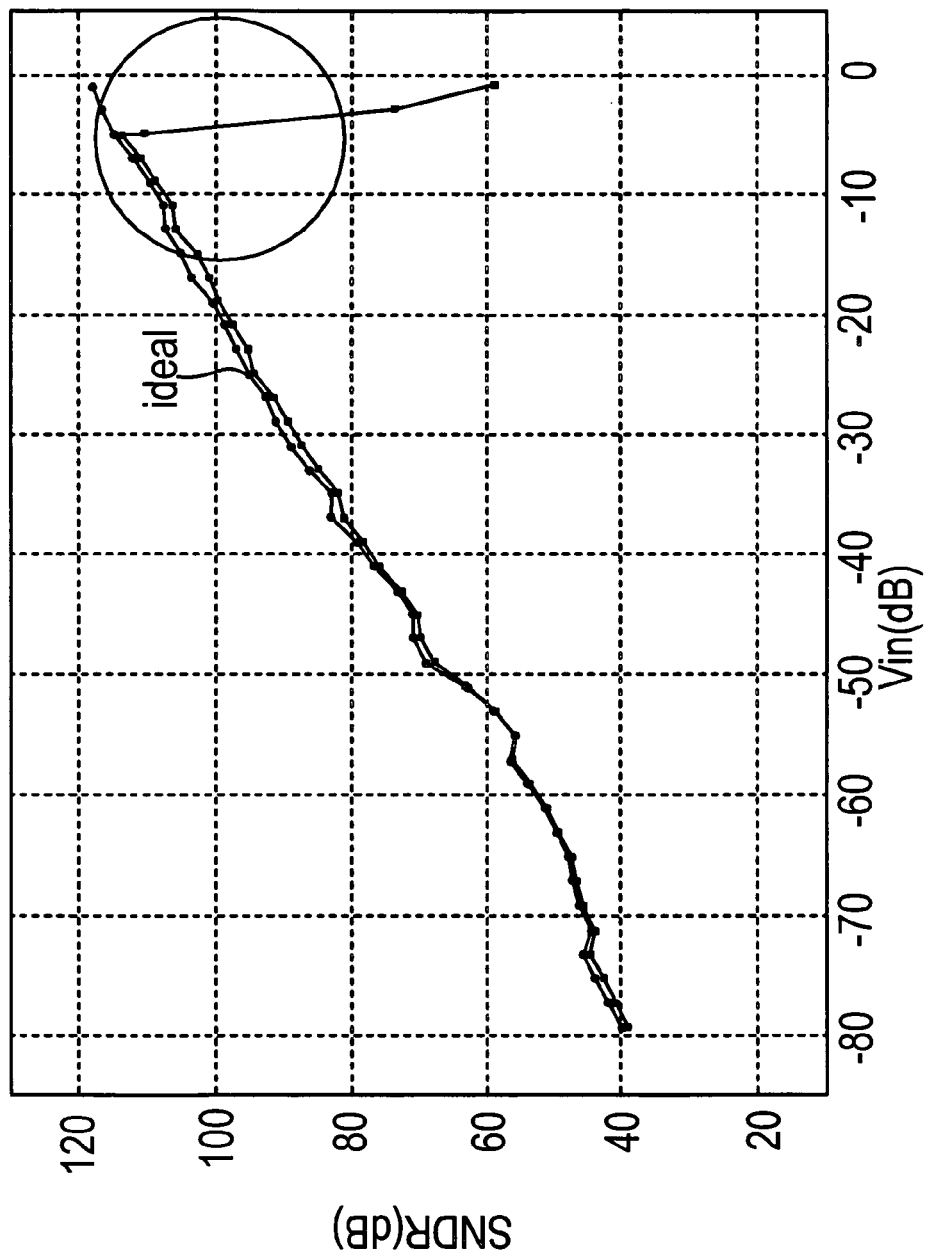
FIG. 10 is a schematic graph of a typical SNDR to input amplitude relationship of FIG. 9.
Figure 13:
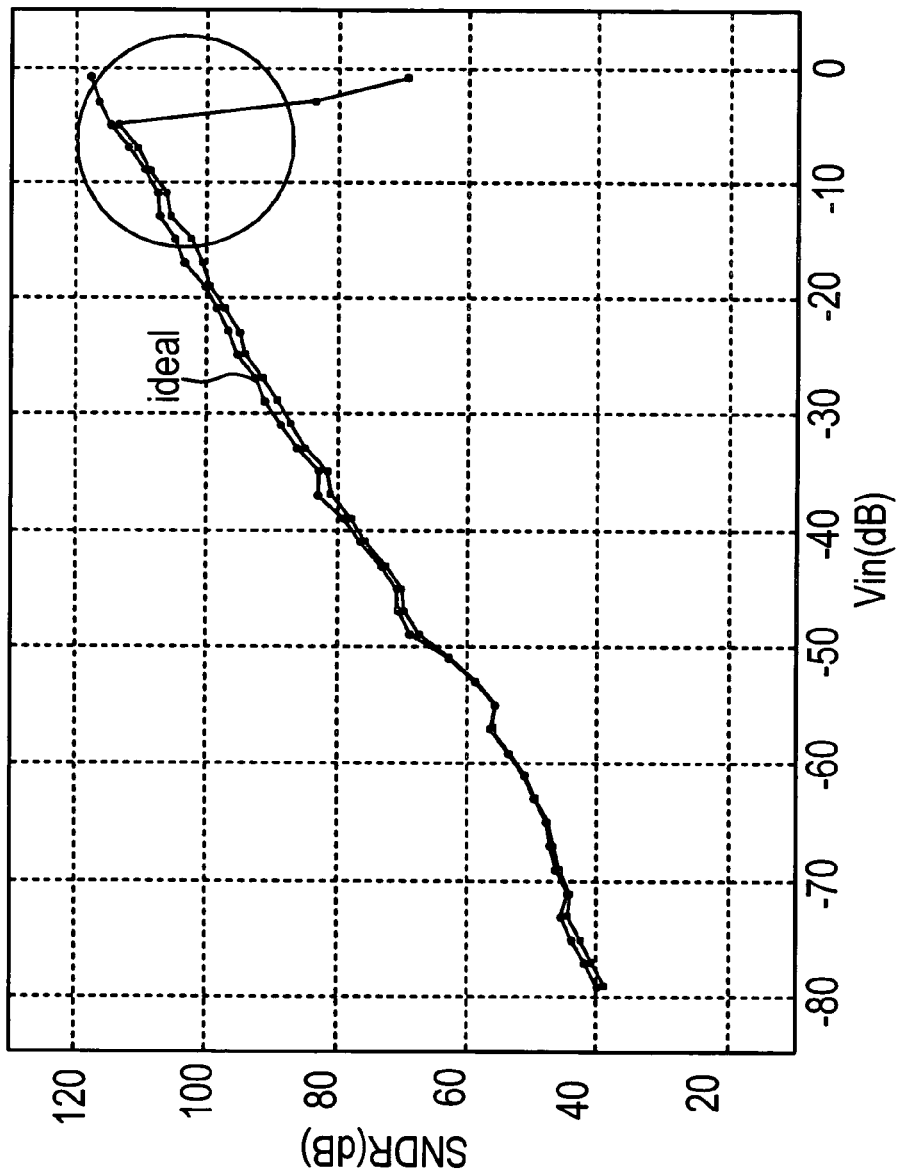
FIG. 13 is a schematic graph of an SNDR to input amplitude relationship according to an embodiment of the invention.
Figure 14:
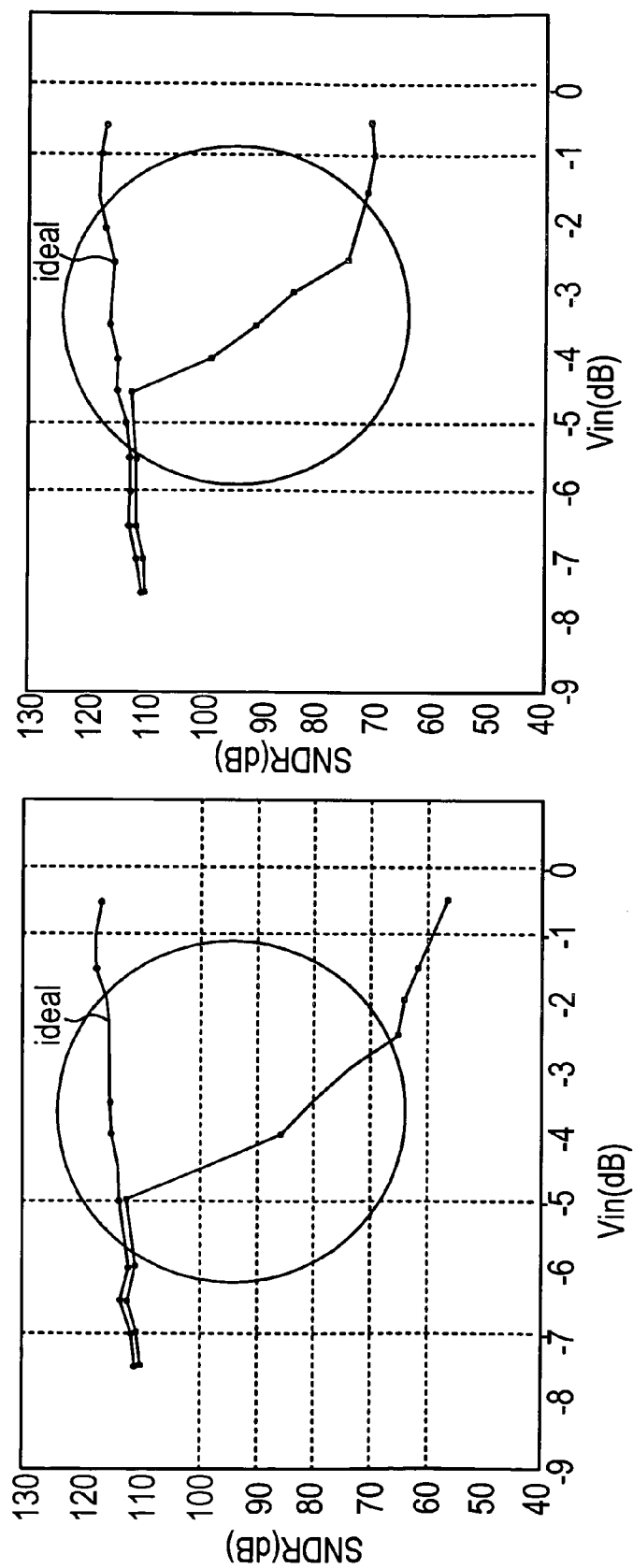
FIG. 14 is a comparison of enlarged portions of FIGS. 10 and 13.

FIG. 13 is a schematic graph of an SNDR to input amplitude relationship according to an embodiment of the invention. In FIG. 13, the invention is applied to a third order sigma-delta modulator (SDM) with a 3-bit DAC. FIG. 14 is a comparison of enlarged portions of FIGS. 10 and 13, the left part for the U.S. Pat. No. 6,753,799 and the right part for the invention. As shown in FIG. 14, in the left part, when the input amplitude is at −4.5 dB, the SNDR is significantly reduced, but in the right part, when the input amplitude is at −4.5 dB, the SNDR just starts the reduction. Therefore, the invention is improved more than the prior art.

FIG. 15 is a schematic graph of another operation of FIG. 11 according to an embodiment of the invention. As shown in FIG. 15, in this case, the dynamic element matching device 1150 selects the next-two digital/analog element succeeding the original non-participant element E8 as the alternate non-participant element. Namely, at time slot t5, the input digital code is 8, and accordingly the non-participant element E8 is also selected. That is, all elements from E1 to E8 are selected. Next, the dynamic element matching device 1150 selects the next-two digital/analog element E2 succeeding the previously selected non-participant element E8 from the participant elements E1 to E7 as the non-participant element. Thus, at time slot t6, the input digital code is 4 and the element E2 is the non-participant element, so the elements E3 to E6 are selected.

FIG. 16 is a schematic graph of a further operation of FIG. 11 according to an embodiment of the invention. As shown in FIG. 16, in this case, the dynamic element matching device 1150 selects an alternate non-participant element randomly from the participant elements. Namely, at time slot t5, the input digital code is 8, and accordingly the non-participant element E8 is also selected. That is, all elements from E1 to E8 are selected. Next, the dynamic element matching device 1150 selects the digital/analog element E5 as the non-participant element that is randomly selected from the participant elements E1 to E7. Thus, at time slot t6, the input digital code is 4 and the element E5 is the non-participant element, so the elements E2, E3, E4 and E6 are selected.

FIG. 17 is a schematic graph of another further operation of FIG. 11 according to an embodiment of the invention. As shown in FIG. 17, in this case, the dynamic element matching device 1150 selects an alternate non-participant element randomly from the participant elements and changes the direction of reselecting the participant elements. Namely, at time slot t5, the input digital code is 8, and accordingly the non-participant element E8 is also selected. That is, all elements from E1 to E8 are selected. Next, the dynamic element matching device 1150 selects the digital/analog element E5 as the non-participant element that is randomly selected from the participant elements E1 to E7 and changes the direction of reselecting the participant elements. Thus, at time slot t6, the input digital code is 4 and the element E5 is the non-participant element, so the elements E8, E7, E6 and E4 are selected in the reverse direction.

In view of the foregoing, it is known that the invention sets a digital/analog element such as E8 as a non-participant element and the others as the participant elements regularly or randomly, and selects or updates the participant elements such as E1 to E7 according to the input digital code. When the input digital code is the maximum such as 8, the previous non-participant element is also selected, so an alternate non-participant element is selected from the previous participant elements in either regular or random way. Next, the participant elements corresponding to the alternate non-participant element and a following input code are selected in either the original direction or a changed direction. Therefore, the invention can increase the disorder degree on selecting the digital/analog elements to further increase the SNDR, in comparison with the prior art.

Although the present invention has been explained in relation to its preferred embodiment, it is to be understood that many other possible modifications and variations can be made without departing from the spirit and scope of the invention as hereinafter claimed.

What is claimed is:

1. A dynamic element matching sigma-delta modulator comprising:
    an adder, for generating an error signal based on a difference between a analog input signal and a feedback signal;
    a loop filter, connected to the adder for receiving the error signal to generate a filtered signal;
    a quantizer, connected to the loop filter for changing the filtered signal into a quantized output signal;
    a digital/analog converter (DAC), connected to the adder and having a plurality of digital/analog elements, for generating the feedback signal to the adder; and
    a dynamic element matching device, connected between the quantizer and the DAC, for receiving the quantized output signal to select the digital/analog elements from the DAC;
    wherein the dynamic element matching device sets one of the digital/analog elements to be a first non-participant element and the others of the digital/analog elements to be participant elements, and reselects participant elements according to the quantized output signal and the participant elements for further generating the feedback signal corresponding to the quantized output signal, wherein the dynamic element matching device resets one of the participant elements to be a second non-participant element and the first non-participant element to be a participant element when the quantized output signal is a predetermined signal, and wherein the predetermined signal is a maximum of the quantized output signal.

2. The dynamic element matching sigma-delta modulator as claimed in claim 1, wherein the dynamic element matching device selects and sets the second non-participant element based on a first predetermined order.

3. The dynamic element matching sigma-delta modulator as claimed in claim 2, wherein the dynamic element matching device selects a digital/analog element right after the first non-participant element from the participant elements as the second non-participant element.

4. The dynamic element matching sigma-delta modulator as claimed in claim 2, wherein the dynamic element matching device selects a next k-th digital/analog element succeeding the first non-participant element from the participant elements as the second non-participant element, where k is a positive integer smaller than or equal to the number of the participant elements.

5. The dynamic element matching sigma-delta modulator as claimed in claim 2, wherein the dynamic element matching device selects the participant elements based on a second predetermined order to generate the feedback signal corresponding to the quantized output signal.

6. The dynamic element matching sigma-delta modulator as claimed in claim 5, wherein the dynamic element matching device selects the participant elements from the participant elements that starts with a digital/analog element following a last selected digital/analog element, thereby generating the feedback signal corresponding to the quantized output signal.

7. The dynamic element matching sigma-delta modulator as claimed in claim 6, wherein the number of participant elements selected equals to the quantized output signal.

8. The dynamic element matching sigma-delta modulator as claimed in claim 7, wherein the quantizer is a multi-bit quantizer, and the DAC is a multi-bit DAC.

9. A dynamic element matching digital/analog conversion system comprising:
    a digital/analog converter (DAC), having a plurality of digital/analog elements to generate an analog output signal corresponding to a digital input signal; and
    a dynamic element matching device, connected to the DAC, for receiving the digital input signal to select the digital/analog elements from the DAC;
    wherein the dynamic element matching device sets one of the digital/analog elements to be a first non-participant element and the others of the digital/analog elements to be participant elements, and reselects the digital/analog elements according to the digital input signal and the participant elements for further generating the analog output signal corresponding to the digital input signal, wherein the dynamic element matching device resets one of the participant elements to be a second non-participant element and the first non-participant element to be a participant element when the digital input signal is a predetermined signal, and wherein the predetermined signal is a maximum of the digital input signal.

10. The dynamic element matching digital/analog conversion system as claimed in claim 9, wherein the dynamic element matching device selects and sets the second non-participant element based on a first predetermined order.

11. The dynamic element matching digital/analog conversion system as claimed in claim 10, wherein the dynamic element matching device selects a digital/analog element right after the first non-participant element from the participant elements as the second non-participant element.

12. The dynamic element matching digital/analog conversion system as claimed in claim 10, wherein the dynamic element matching device selects a next k-th digital/analog element succeeding the first non-participant element from the participant elements as the second non-participant element, where k is a positive integer smaller than or equal to the number of the participant elements.

13. The dynamic element matching digital/analog conversion system as claimed in claim 12, wherein the dynamic element matching device selects the participant elements based on a second predetermined order to generate the analog output signal corresponding to the digital input signal.

14. The dynamic element matching digital/analog conversion system as claimed in claim 13, wherein the dynamic element matching device selects the participant elements from the participant elements as the digital/analog element following a last selected digital/analog element, thereby generating the analog output signal corresponding to the digital input signal.

15. The dynamic element matching digital/analog conversion system as claimed in claim 14, wherein the number of participant elements selected equals to the digital input signal.

16. The dynamic element matching digital/analog conversion system as claimed in claim 15, wherein the DAC is a multi-bit DAC.

* * * * *